US009891277B2

(12) United States Patent
Knight et al.

(10) Patent No.: US 9,891,277 B2
(45) Date of Patent: Feb. 13, 2018

(54) SECURE LOW VOLTAGE TESTING

(71) Applicant: FREESCALE SEMICONDUCTOR, INC., Austin, TX (US)

(72) Inventors: Joel R. Knight, Austin, TX (US);
James B. Eifert, Austin, TX (US);
Stefano Pietri, Austin, TX (US);
Steven K. Watkins, Austin, TX (US)

(73) Assignee: NXP USA, Inc., Austin, TX (US)

( * ) Notice: Subject to any disclaimer, the term of this patent is extended or adjusted under 35 U.S.C. 154(b) by 594 days.

(21) Appl. No.: 14/502,406

(22) Filed: Sep. 30, 2014

(65) Prior Publication Data

US 2016/0091561 A1   Mar. 31, 2016

(51) Int. Cl.
G01R 31/28 (2006.01)
G01R 31/317 (2006.01)
(52) U.S. Cl.
CPC . G01R 31/31719 (2013.01); G01R 31/31701 (2013.01)
(58) Field of Classification Search
CPC ..................................... G01R 31/28–31/31937
See application file for complete search history.

(56) References Cited

U.S. PATENT DOCUMENTS

| 3,978,476 | A |   | 8/1976  | Tanigawa |  |
|-----------|---|---|---------|----------|--|
| 4,634,110 | A |   | 1/1987  | Julich et al. | |
| 4,742,482 | A |   | 5/1988  | Inskeep et al. | |
| 5,210,769 | A | * | 5/1993  | Seidel ..................... G01F 23/00 340/450 |
| 5,260,950 | A |   | 11/1993 | Simpson et al. | |
| 5,404,359 | A |   | 4/1995  | Gillenwater et al. | |
| 5,515,539 | A | * | 5/1996  | Ohashi .................. G06F 1/3215 713/324 |
| 5,522,040 | A |   | 5/1996  | Hofsass et al. | |
| 5,659,551 | A |   | 8/1997  | Huott et al. | |
| 5,805,789 | A |   | 9/1998  | Huott et al. | |
| 5,905,690 | A | * | 5/1999  | Sakurai ............ G01R 31/31701 365/201 |
| 6,181,614 | B1 |  | 1/2001  | Aipperspach et al. | |
| 6,188,257 | B1 |  | 2/2001  | Buer | |
| 6,211,665 | B1 | * | 4/2001  | Ahrendt ............... G01D 5/2013 324/207.16 |
| 6,289,457 | B1 | * | 9/2001  | Bishop .................... G06F 21/00 726/21 |
| 7,181,579 | B2 |  | 2/2007  | Von Campenhausen et al. | |

(Continued)

FOREIGN PATENT DOCUMENTS

EP  0458803 B1  5/1994

*Primary Examiner* — Huy Q Phan
*Assistant Examiner* — David Frederiksen

(57) ABSTRACT

An integrated circuit includes a normal voltage detector configured to detect a normal voltage at which the integrated circuit being fully functional. A first voltage detector detects a first voltage that is less than the normal voltage. A second voltage detector detects a second voltage that is less than the first voltage. A reset module is coupled to a supply voltage, the normal voltage detector, the first voltage detector, and the second voltage detector. The reset module includes test logic to, when the supply voltage rises to the first voltage from the second voltage, perform a pass/fail test when the integrated circuit is in a pass/fail test mode, and perform a power up reset when the integrated circuit in not in the pass/fail test mode.

18 Claims, 2 Drawing Sheets

(56) References Cited

U.S. PATENT DOCUMENTS

| | | | |
|---|---|---|---|
| 7,339,848 B1 | 3/2008 | Stansell et al. | |
| 8,171,323 B2* | 5/2012 | Rakshani | G06F 1/3203 |
| | | | 713/300 |
| 2003/0135345 A1 | 7/2003 | Seitz | |
| 2005/0231227 A1* | 10/2005 | Ohashi | G01R 31/3191 |
| | | | 324/762.01 |
| 2006/0071682 A1* | 4/2006 | Hashimoto | G01R 31/3004 |
| | | | 324/764.01 |
| 2006/0072265 A1 | 4/2006 | Bucella et al. | |
| 2006/0214811 A1* | 9/2006 | Barrieau | G08B 17/10 |
| | | | 340/635 |
| 2007/0205755 A1* | 9/2007 | Fujieda | G01R 31/3008 |
| | | | 324/750.3 |
| 2008/0319768 A1 | 12/2008 | Kreiner et al. | |
| 2009/0223802 A1 | 9/2009 | Zak | |
| 2010/0134132 A1* | 6/2010 | Price | G01R 19/1659 |
| | | | 324/755.01 |
| 2011/0051520 A1* | 3/2011 | Kim | G11C 11/5628 |
| | | | 365/185.19 |
| 2011/0148482 A1* | 6/2011 | Gussoni | G06F 1/26 |
| | | | 327/143 |
| 2011/0234268 A1* | 9/2011 | Chi | H03K 17/223 |
| | | | 327/143 |
| 2012/0139624 A1* | 6/2012 | Senthinathan | G06F 1/3243 |
| | | | 327/540 |
| 2013/0132007 A1* | 5/2013 | Dunnihoo | G01R 31/26 |
| | | | 702/58 |
| 2013/0163324 A1* | 6/2013 | Noh | G11C 11/5628 |
| | | | 365/185.02 |
| 2013/0290797 A1 | 10/2013 | He et al. | |

* cited by examiner

SECURE LOW VOLTAGE TESTING

BACKGROUND

Field

This disclosure relates generally to integrated circuits, and more particularly, to secure low voltage testability of integrated circuits.

Related Art

Testability of integrated circuits continues to be a significant issue, especially since complexity increases by the square for a given improvement in a linear dimension such as gate length of a transistor. If one dimension of a transistor that occupies a square decreases by 10 percent, which implies the new side is 0.9 of the original, then the area becomes 0.81 of the original area. Testing improves as a well but not by the square. Thus complexity, and thus test time, has increased at a greater rate than improvements in the speed of test equipment. Thus, the benefit of onboard testing, often called built in self test (BIST), continues to be popular. One of the areas where testing is challenging is at low voltage. Low voltage testing is important for providing margin and predicting failures. It is also important for obtaining characteristics, such as lowest voltage of operation, of an integrated circuit. Also tracking effects of a given process over time is also important at low voltage. Low voltage testing can be challenging because the integrated circuit will stop functioning properly with a sufficient drop in voltage which is a reason for the low voltage testing to be secure. It is generally undesirable to perform low voltage testing when the integrated circuit is being used in a product because it may not operate properly and cause the product to fail. Thus, the ability to prevent a user of the integrated circuit from performing low voltage operations including testing can be critical Accordingly there is a need to provide further improvement in performing secure low voltage testability of integrated circuits.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a multi-level power on reset circuit is used to aid in testing the integrated circuit when a power supply voltage is between a normal operating voltage level and first voltage level and when the power supply voltage is between the first voltage level and a second voltage level. This is better understood by reference to the drawings and the following written description.

Figure 1:
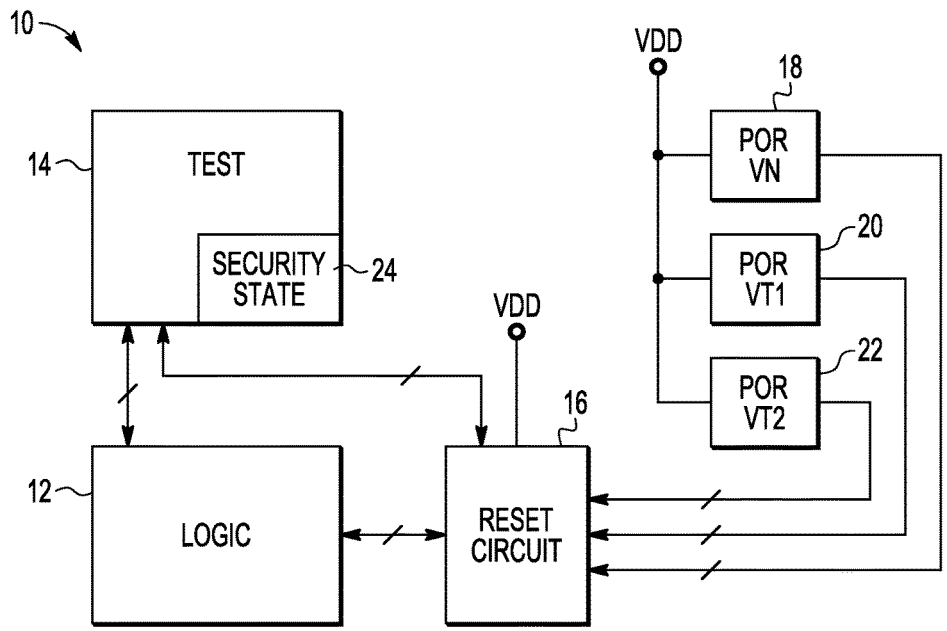
FIG. 1 is a block diagram of an integrated circuit having a multi-level power on reset (POR) capability.

Shown in FIG. 1 is an integrated circuit 10 having a logic circuit 12, a test circuit 14 coupled to logic circuit 12, a reset circuit 16, which may be referenced as a reset module, coupled to test circuit 14 and logic circuit 12, a power on reset (POR) circuit 18 coupled to reset circuit 16, a POR circuit 20 coupled to reset circuit 16, a POR circuit 22 coupled to reset circuit 16, and a security state circuit 24 in test circuit 14. A positive power supply voltage VDD is coupled to logic circuit 12, test circuit 14, reset circuit 16, POR circuit 18, a POR circuit 20, and POR circuit 22. In operation logic circuit 12 performs functions useful in aiding desired operations of a product that employs integrated circuit 10. POR circuit 18 provides a signal POR VN that indicates that power supply voltage VDD has crossed a normal operating voltage VN. Reset circuit 16 performs power up operations when power supply voltage VDD has increased to reach or exceed normal operating voltage VN. When power supply voltage VDD crosses a test voltage VT1, POR circuit 20 provides a signal POR VT1. When power supply voltage VDD crosses a test voltage VT2 that is lower that test voltage VT1, POR circuit 22 provides a signal POR VT1. Test circuit 14 may perform test operations, when in a proper test mode, on logic circuit 12 if VDD is between voltage VN and voltage VT1 or is between voltage VT1 and voltage VT2. Reset circuit 16 provides the necessary information to test circuit 14 to determine which test to perform. Reset circuit 16 reads the security state circuit 24 in order to properly direct test circuit 14. When POR circuit 18 has detected that power supply voltage VDD is below voltage VN and generates POR VN, it is intended to ensure a reset of logic circuit 12. POR VN, however, can be bypassed so that testing can occur even if POR VN is indicating a reset. Similarly, POR VT1, when generated, is intended to cause a reset but it can also be bypassed and allow testing of logic circuit 12. POR VT2, when generated, is also intended to ensure a reset, but it cannot be bypassed. Reset as used here, is the case where reset circuit 16 directs logic circuit 12 to a known stable state, which may be called a reset state. Reset is particularly useful in a situation where the power supply voltage becomes too low for normal operation. Thus, reset arising from the power supply voltage falling below some level, for example VN, may be called power down reset. In normal operation, coming out of reset does not occur until VDD rises to VN. Thus, in normal operation, reset circuit 16 is responsive to POR VN as to when logic circuit 12 is to be held in reset or released from reset. In certain test modes, reset circuit 16 bypasses POR VN and is responsive to POR VT1 or POR VT2 as to when logic circuit 12 is released from reset, enters reset, or is held in reset.

Figure 2:
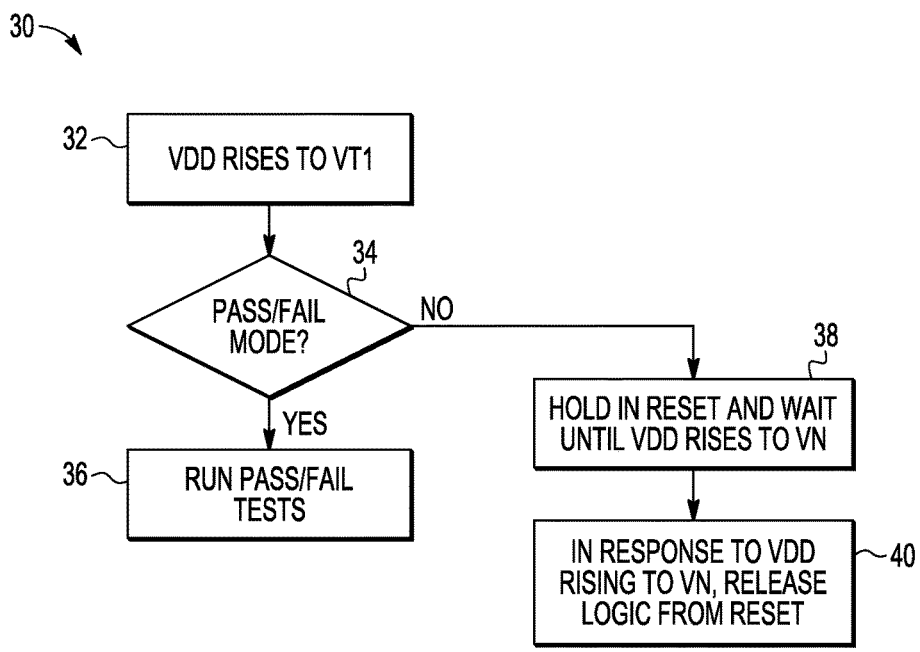
FIG. 2 is a flow diagram of a first operation of the multi-level POR of the integrated circuit of FIG. 1.

Shown in FIG. 2 is a flow chart 30 depicting power supply voltage VDD when it is rising in magnitude. In this example, POR circuit 22 is not used to detect power supply voltage VDD when it rises. Thus, the first response is by POR circuit 20 that detects that power supply voltage VDD has risen to test voltage VT1 as shown in step 32. A determination is made to decide if a pass/fail test mode is to be entered at step 34. The pass/fail test mode is for determining if integrated circuit 10 passes the tests that ensure its functionality. To enter the pass/fail test mode with power supply voltage VDD below voltage VN, security state circuit 24 must allow the bypass of POR VN. POR VN is generated in response to power supply voltage VDD dropping below voltage VN. Security state circuit 24 ensures that an unauthorized party cannot operate the circuit in a low voltage state. If security state 24 allows the bypass of POR VN, logic circuit 12 is taken out of reset, and then the pass/fail tests are run in step 36. If the pass/fail mode is not allowed, then logic circuit 12 is held in reset until power supply voltage VDD rises to voltage VN at step 38, and then at step 40 logic circuit 12 is released from reset and begins normal operation.

Figure 3:
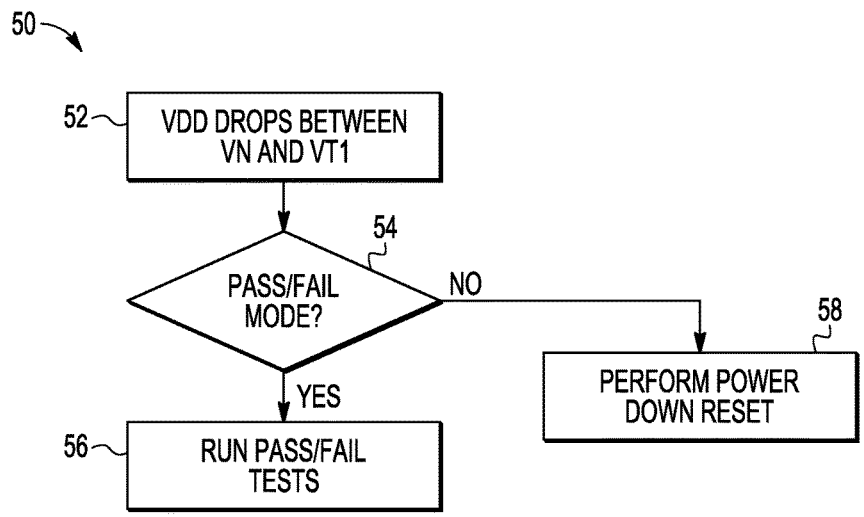
FIG. 3 is a flow diagram of a second operation of the multi-level POR of the integrated circuit of FIG. 1.

Shown in FIG. 3 is a flow chart 50 depicting the case of power supply voltage VDD dropping below voltage VN. This begins at step 52 which is that power supply voltage VDD has dropped below VN but has not dropped below VT1. A determination at step 54 is made to determine if pass/fail tests are to be performed. If yes, pass fail tests are run in step 56 and POR VN is bypassed. If not, then a power down reset is performed at step 58. In the case of pass/fail tests being run, this is allowed only if security state allows it. The power down reset is a common process used for circuits that can lose power, especially complex circuits such as controllers.

Figure 4:
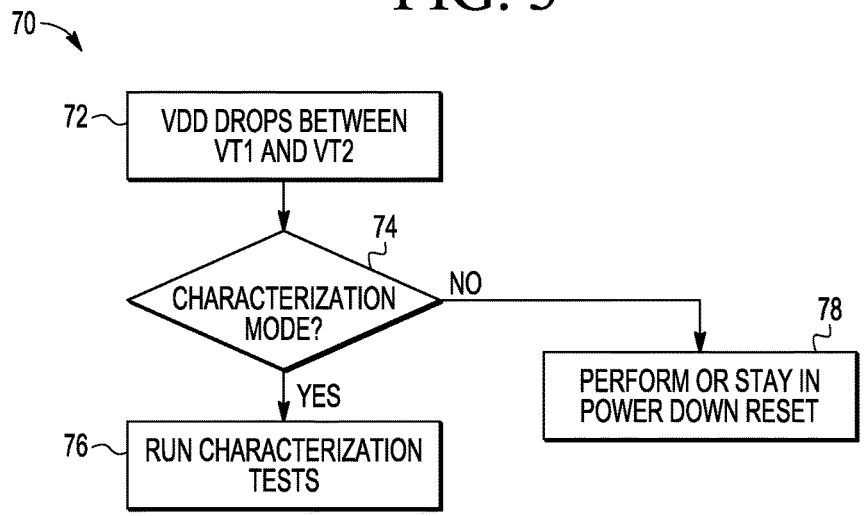
FIG. 4 is a flow diagram of a third operation of the multi-level POR of the integrated circuit of FIG. 1.

Shown in FIG. 4 is a flow chart 70 depicting the case of power supply voltage VDD dropping below VT1 but remaining above VT2, shown in step 72, after having dropped below voltage VN which generated POR VN. Power supply voltage VDD dropping below voltage VT1 causes the generation of POR VT1 which intends to perform, maintain, or continue a power down reset of logic circuit 12. At step 74, a determination is made if a characterization test mode is to be entered. As for all of the test modes that are performed at a voltage below voltage VN, security state circuit 24 must allow it. In this case, to enter the characterization test mode, both POR VN and POR VT1 must be bypassed which is controlled by security state circuit 24. Thus, with POR VN and POR VT1 being bypassed, characterization tests may be performed at step 76. Characterization tests are of the type that often require multiple voltages such as a determination of the magnitude of power supply voltage VDD at which logic circuit 12 stops functioning. Other characterization tests include measuring capacitances, switch points, leakage current, etc. If the characterization mode is not to be entered, then power down reset is performed or maintained as shown in step 78.

Figure 5:
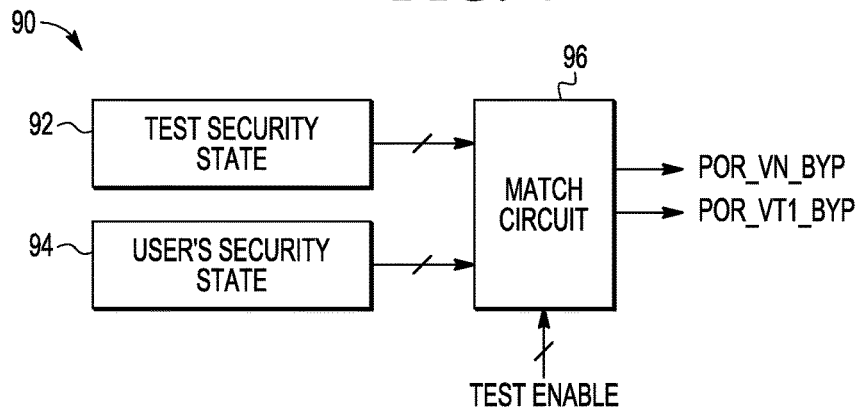
FIG. 5 is a block diagram of a portion of the integrated circuit of FIG. 1.

Shown in FIG. 5 is circuit 90 having test security state 92 and a user's security state 94 from security state circuit 24 and a match circuit from reset circuit 16. Test security state 92 has an output coupled to match circuit 96. User's security state 94 has an output coupled to match circuit 96, and match circuit 96 has outputs POR_VN_BYP and POR_VT_BYP, POR_VN_BYP and POR_VT_BYP are bypass signals, that when active, cause POR VN and POR VT to be bypassed. Test enable indicates that a particular class of test, such as the characterization tests and the pass/fail tests are being requested. The test security state 92 and/or user's security state 94 confirm the validity or invalidity of the request. If valid, one or both of bypass signals POR_VN_BYP and POR_VT_BYP are generated. User's security state 94 is particularly useful for the situation in which logic 12 has been found to be not working properly in usage. Logic circuit 12 is altered so as to be unusable but nonetheless testable after having been locked from entering any low voltage mode. Match circuit 96, when the user invokes user's security state 94, responds by bypassing one or both of POR VT1 and POR VN.

Thus it is shown that secure testing for both pass/fail and characterization can be achieved using a selective bypass of the signals that ordinarily generate reset due to either powering up or powering down.

By now it is apparent that there has been described an integrated circuit including a normal voltage detector configured to detect a normal voltage, the integrated circuit being fully functional at the normal voltage. The integrated circuit further includes a first voltage detector configured to detect a first voltage, the first voltage is less than the normal voltage. The integrated circuit further includes a second voltage detector configured to detect a second voltage, the second voltage is less than the first voltage. The integrated circuit further includes a reset module coupled to a supply voltage, the normal voltage detector, the first voltage detector, and the second voltage detector, the reset module including test logic operable to, when when the supply voltage rises to the first voltage from the second voltage, determine the integrated circuit is in a pass/fail test mode when a first security test is passed, when the integrated circuit is in the pass/fail test mode, perform a pass/fail test, and when the integrated circuit in not in the pass/fail test mode, perform a power up reset. The integrated circuit may have a further characterization in which wherein the test logic is further operable to, when the normal voltage drops to a value between the normal voltage and the first voltage, determine the integrated circuit is in a pass/fail test mode when the first security test is passed, when the integrated circuit is in the pass/fail test mode, perform a pass/fail test, and when the integrated circuit in not in the pass/fail test mode, perform power down reset. The integrated circuit may have a further characterization in which the test logic is further operable to, when the supply voltage drops to a value between the first voltage and the second voltage, determine that the integrated circuit is in a characterization test mode when a second security test is passed, and when the integrated circuit is in the characterization test mode, perform a characterization test. The integrated circuit may have a further characterization in which the first security test determines that a test security state matches a selected value. The integrated circuit may have a further characterization in which the second security test determines that a user's security state matches a selected value. The integrated circuit may have a further characterization in which the pass/fail test determines whether at least a portion of the integrated circuit operates correctly at a voltage less than the normal voltage. The integrated circuit may have a further characterization in which the power up reset is performed in response to the supply voltage rising to the normal voltage. The integrated circuit may have a further characterization in which the characterization test determines a voltage level where at least a portion of the integrated circuit does not operate correctly. The integrated circuit may have a further characterization in which the pass/fail test is performed when a user's security state is unlocked after having been locked, the first security test is passed, and a test enable signal is set. The integrated circuit may have a further characterization in which the characterization test is performed when the second security test is passed and a test enable signal is set. The integrated circuit may have a further characterization in which the fail/pass test is performed when the first security test is passed and a test enable signal is set.

Also described is a processing system including a normal voltage detector configured to detect a normal voltage, the processing system being fully functional at the normal voltage. The processing system further includes a first voltage detector configured to detect a first voltage, the first voltage is less than the normal voltage and the processing system is only partially functional at the first voltage. The processing system further includes a second voltage detector configured to detect a second voltage, the second voltage is less than the first voltage and the processing system is not functional at the second voltage. The processing system further includes a reset module coupled to a supply voltage, the normal voltage detector, the first voltage detector, and the second voltage detector, the reset module including test logic operable to, when the supply voltage drops to a value between the first voltage and the second voltage, determine that the processing system is in a characterization test mode when a first security test is passed and when the processing system is in the characterization test mode, perform a characterization test. The processing system may have a further characterization in which the test logic is further operable to, when the supply voltage rises to the first voltage from the second voltage, determine the processing system is in a pass/fail test mode when a second security test is passed, when the processing system is in a pass/fail test mode, perform a pass/fail test, and when the processing system in not in the pass/fail test mode, enter a power up reset mode in response to the supply voltage rising to the normal voltage. The processing system may have a further characterization in which the test logic is further operable to, when the normal voltage drops to a value between the normal voltage and the first voltage, determine the processing system is in the pass/fail test mode when the second security test is passed, when the integrated circuit is in the pass/fail test mode, perform a pass/fail test, and when the processing system in not in the pass/fail test mode, enter a power down reset mode. The processing system may have a further characterization in which the second security test determines that a test security state matches a selected value. The processing system may have a further characterization in which the first security test determines that a user's security state matches a selected value. The processing system may have a further characterization in which the pass/fail test determines whether at least a portion of the processing system operates correctly at a voltage less than the normal voltage. The processing system may have a further characterization in which the characterization test determines a voltage level where at least a portion of the integrated circuit does not operate correctly.

Described also is a method including performing a fail/pass test when an integrated circuit is in a pass/fail mode, in which a test security state matches a specified value, and one of a group consisting of a supply voltage to the integrated circuit drops to a value between a normal operating voltage and a first voltage that is lower than the normal operating voltage, and the supply voltage rises to the first voltage from a second voltage that is lower than the first voltage. The method further includes determining whether at least a portion of the integrated circuit operates correctly at a voltage less than the normal operating voltage. The method may further include performing a characterization test when the integrated circuit is in a characterization mode, a user's security state matches another specified value, and the supply voltage drops to a value between the first voltage and the second voltage, wherein the characterization test determines a voltage level where at least a portion of the integrated circuit does not operate correctly.

Although the invention is described herein with reference to specific embodiments, various modifications and changes can be made without departing from the scope of the present invention as set forth in the claims below. For example, the particular characterization and pass/fail tests can vary widely. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit, comprising:
    a normal voltage detector configured to detect a normal voltage, the integrated circuit being fully functional at the normal voltage;
    a first voltage detector configured to detect a first voltage, the first voltage is less than the normal voltage;
    a second voltage detector configured to detect a second voltage, the second voltage is less than the first voltage;
    a reset module coupled to a supply voltage, the normal voltage detector, the first voltage detector, and the second voltage detector, the reset module including test logic operable to:
    when the supply voltage rises to the first voltage from the second voltage,
        determine the integrated circuit is in a pass/fail test mode when a first security test is passed;
        when the integrated circuit is in the pass/fail test mode, perform a pass/fail test; and
        when the integrated circuit in not in the pass/fail test mode, perform a power up reset.

2. The integrated circuit of claim 1, wherein the test logic is further operable to:
    when the normal voltage drops to a value between the normal voltage and the first voltage,
        determine the integrated circuit is in a pass/fail test mode when the first security test is passed;
        when the integrated circuit is in the pass/fail test mode, perform a pass/fail test; and
        when the integrated circuit in not in the pass/fail test mode, perform power down reset.

3. The integrated circuit of claim 1, wherein the test logic is further operable to:
    when the supply voltage drops to a value between the first voltage and the second voltage,
        determine that the integrated circuit is in a characterization test mode when a second security test is passed;
        when the integrated circuit is in the characterization test mode, perform a characterization test.

4. The integrated circuit of claim 3, wherein the second security test determines that a user's security state matches a selected value.

5. The integrated circuit of claim 3, wherein the characterization test determines a voltage level where at least a portion of the integrated circuit does not operate correctly.

6. The integrated circuit of claim 3, wherein the pass/fail test is performed when a user's security state is unlocked after having been locked, the first security test is passed, and a test enable signal is set.

7. The integrated circuit of claim 3, wherein the characterization test is performed when the second security test is passed and a test enable signal is set.

8. The integrated circuit of claim 1, wherein the first security test determines that a test security state matches a selected value.

9. The integrated circuit of claim 1, wherein the pass/fail test determines whether at least a portion of the integrated circuit operates correctly at a voltage less than the normal voltage.

10. The integrated circuit of claim 1, wherein the power up reset is performed in response to the supply voltage rising to the normal voltage.

11. The integrated circuit of claim 1, wherein the fail/pass test is performed when the first security test is passed and a test enable signal is set.

12. A processing system comprising:
a normal voltage detector configured to detect a normal voltage, the processing system being fully functional at the normal voltage;
a first voltage detector configured to detect a first voltage, the first voltage is less than the normal voltage and the processing system is only partially functional at the first voltage;
a second voltage detector configured to detect a second voltage, the second voltage is less than the first voltage and the processing system is not functional at the second voltage;
a reset module coupled to a supply voltage, the normal voltage detector, the first voltage detector, and the second voltage detector, the reset module including test logic operable to:
when the supply voltage drops to a value between the first voltage and the second voltage,
determine that the processing system is in a characterization test mode when a first security test is passed; and
when the processing system is in the characterization test mode, perform a characterization test.

13. The processing system of claim 12, wherein the test logic is further operable to:
when the supply voltage rises to the first voltage from the second voltage,
determine the processing system is in a pass/fail test mode when a second security test is passed;
when the processing system is in a pass/fail test mode, perform a pass/fail test; and
when the processing system in not in the pass/fail test mode, enter a power up reset mode in response to the supply voltage rising to the normal voltage.

14. The processing system of claim 13, wherein the test logic is further operable to:
when the normal voltage drops to a value between the normal voltage and the first voltage,
determine the processing system is in the pass/fail test mode when the second security test is passed;
when the integrated circuit is in the pass/fail test mode, perform a pass/fail test; and
when the processing system in not in the pass/fail test mode, enter a power down reset mode.

15. The processing system of claim 14, wherein the second security test determines that a test security state matches a selected value.

16. The processing system of claim 14, wherein the pass/fail test determines whether at least a portion of the processing system operates correctly at a voltage less than the normal voltage.

17. The processing system of claim 12, wherein the first security test determines that a user's security state matches a selected value.

18. The processing system of claim 12, wherein the characterization test determines a voltage level where at least a portion of the integrated circuit does not operate correctly.

* * * * *